(12) United States Patent
Mo et al.

(10) Patent No.: US 9,425,995 B2
(45) Date of Patent: Aug. 23, 2016

(54) IMPEDANCE MATCHING DEVICE-INTEGRATED NETWORK SIGNAL PROCESSING CIRCUIT

(71) Applicant: AJOHO ENTERPRISE CO., LTD., Taipei (TW)

(72) Inventors: Chia-Ping Mo, Taipei (TW); You-Chi Liu, Taipei (TW)

(73) Assignee: AJOHO ENTERPRISE CO., LTD., Taipei (TW)

( * ) Notice: Subject to any disclaimer, the term of this patent is extended or adjusted under 35 U.S.C. 154(b) by 0 days.

(21) Appl. No.: 14/701,142

(22) Filed: Apr. 30, 2015

(65) Prior Publication Data

US 2015/0236874 A1  Aug. 20, 2015

Related U.S. Application Data

(63) Continuation-in-part of application No. 13/683,939, filed on Nov. 21, 2012, now Pat. No. 9,161,435, which is a continuation-in-part of application No. 13/544,538, filed on Jul. 9, 2012, now Pat. No. 8,878,628, application No. 14/701,142, which is a continuation-in-part of application No. 13/893,962, filed on May 14, 2013, now Pat. No. 9,252,735, which is a continuation-in-part of application No. 13/544,538, application No. 14/701,142, which is a continuation-in-part of application No. 14/021,276, filed on Sep. 9, 2013, now Pat. No. 9,270,499, which is a continuation-in-part of application No. 13/544,538.

(30) Foreign Application Priority Data

| Apr. 6, 2012 | (TW) | ............................... 101112238 A |
| Sep. 14, 2012 | (TW) | ............................... 101217845 A |
| Feb. 4, 2013 | (TW) | ............................... 102202378 A |

(51) Int. Cl.
| H04B 1/38 | (2015.01) |
| H04L 5/16 | (2006.01) |
| H04L 25/02 | (2006.01) |
| H03H 7/38 | (2006.01) |

(52) U.S. Cl.
CPC ............ *H04L 25/0278* (2013.01); *H03H 7/38* (2013.01)

(58) Field of Classification Search
CPC ............................. H04L 25/0278; H03H 7/38
USPC .......................................................... 375/220
See application file for complete search history.

(56) References Cited

U.S. PATENT DOCUMENTS

| 3,681,612 | A | 8/1972 | Vogl et al. |
| 4,761,623 | A | 8/1988 | Schneider |
| 6,184,693 | B1 * | 2/2001 | Arai ................... G01R 29/0814 324/144 |
| 8,203,400 | B2 | 6/2012 | Chen et al. |
| 8,319,579 | B2 | 11/2012 | Zhuang et al. |
| 2011/0059694 | A1 | 3/2011 | Audic |
| 2013/0278355 | A1 | 10/2013 | Shibata |

FOREIGN PATENT DOCUMENTS

TW           436860         9/2012

* cited by examiner

*Primary Examiner* — Tanmay Shah
(74) *Attorney, Agent, or Firm* — Muncy, Geissler, Olds & Lowe, P.C.

(57) ABSTRACT

An impedance matching device-integrated network signal processing circuit includes a first connection terminal electrically connected to the network chip, a second connection terminal electrically connected to the network connector, a plurality of circuit paths electrically connected between the first connection terminal and the second connection terminal, a coupling circuit including a plurality of capacitors respectively connected in series to the circuit paths and a plurality of inductors respectively connected in parallel between each two adjacent circuit paths, and a plurality of impedance matching devices respectively electrically connected in series to each two adjacent circuit paths, each impedance matching device including two microstrip coils respectively electrically connected in series to each two adjacent circuit paths between the first connection terminal and respective the inductors to keep the impedance at the motherboard of the computer in balance with the impedance at the network cable, avoiding signal interference and achieving signal transmission stability.

3 Claims, 7 Drawing Sheets

IMPEDANCE MATCHING DEVICE-INTEGRATED NETWORK SIGNAL PROCESSING CIRCUIT

CROSS REFERENCE TO RELATED APPLICATIONS

This application is a Continuation-in-Part of co-pending Application Ser. No. 13/683,939, filed on Nov. 21, 2012, which is a Continuation-In-Part of application Ser. No. 13/544,538, filed on Jul. 9, 2012; and this application is Continuation-in-Part of co-pending application Ser. No. 13/893,962, filed on May 14, 2013, which is a Continuation-In-Part of application Ser. No. 13/544,538, filed on Jul. 9, 2012; and this application is Continuation-in-Part of co-pending application Ser. No. 14/021,276, filed on Sep. 9, 2013, which is a Continuation-In-Part of application Ser. No. 13/544,538, filed on Jul. 9, 2012; for which priority is claimed under 35 U.S.C. §120, the entire contents of all of which are hereby incorporated by reference.

This application claims the priority benefit of application Ser. No. 101112238 filed in Taiwan on Apr. 6, 2012, Application Ser. No. 101217845 filed in Taiwan on Sep. 14, 2012, and application Ser. No. 102202378 filed in Taiwan on Feb. 4, 2013.

BACKGROUND OF THE INVENTION

1. Field of the Invention

The present invention relates to network technology and more particularly, to an impedance matching device-integrated network signal processing circuit, which has a microstrip coil of an impedance matching device connected in series to each circuit path thereof to keep input impedance and output impedance in balance, achieving the purpose of network signal transmission stability.

2. Description of the Related Art

With fast development of computer technology, desk computers and notebook computers are well developed and widely used in different fields for different applications. It is the market trend to provide computers having high operating speed and small size. Further, network communication technology brings people closer together, helping people to gather information about living, learning, working and recreational activities. By means of network communication, people can communicate with one another to send real time information, advertising propaganda or e-mail. Further, through the Internet, people can search information, send instant messages, or play on-line video games. The development of computer technology makes the relationship between people and network unshakable and inseparable. Network information can spread far and wide without restrictions on time, place or space. Further, through the Internet, people can upload, download, back up all the necessary information for daily life, work, study or consultation. A variety of network platforms are available for shopping, information sharing, and exchange of experiences. Internet applications are now more powerful than ever. Men or women are fond of social networking applications.

Figure 7:
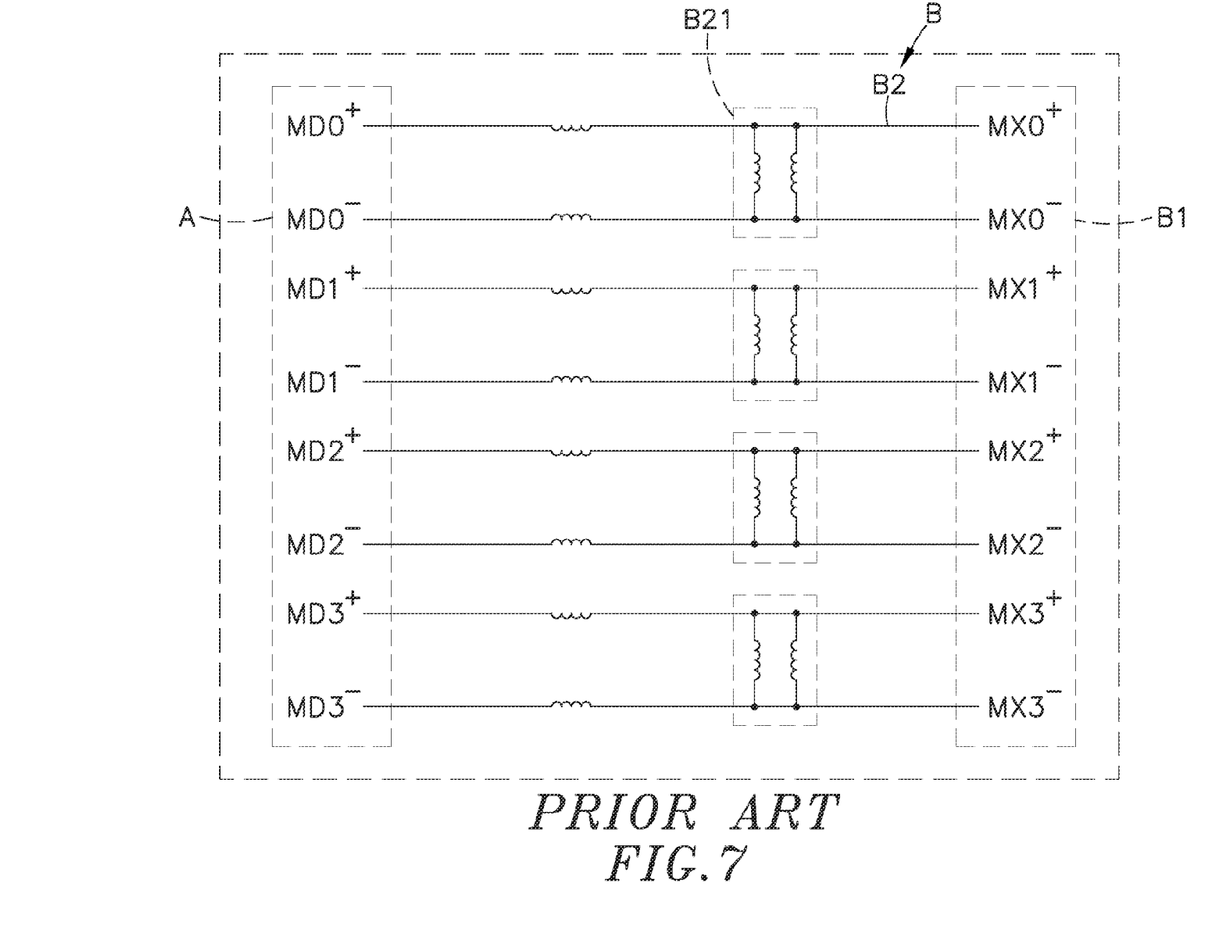
FIG. 7 is a simple circuit diagram of a network signal processing circuit according to the prior art.

In a network, cable or wireless interference means may be selectively used for data transmission. The technology of cable connection for network application needs to use network connectors. With the development of network applications, the data transmission capacity is greatly increased. In order to satisfy users demands, network connection speed has been greatly improved from the rate of 10 Mbps up to 100 Mbps or 1 Gbps. The advanced fiber optic network speed can support 10 Gbps. Further, computer networks are categorized by their scope or scale. The usually said categories of networks are LAN (local area network), MAN (metropolitan area network), WAN (wide area network). The most well-known WAN is the Internet. When linking a network signal, or uploading or downloading network data, the network signal is transmitted from a network signal cable through a network connector to a motherboard in a computer. During the transmission of the network signal, an impedance mismatch occurs between the motherboard of the computer and the network cable (for example, the impedance at the network connector is about 100Ω; the impedance at the motherboard of the computer is about 85Ω), resulting in signal interference, network signal transmission instability or interruption of signal. According to the conventional design, as shown in FIG. 7, the motherboard A of the computer is connected to the network cable B1 through the network connector B so that the motherboard A can get network signals, however, the impedance mismatch between the motherboard A (85Ω) and the network cable B1 (100Ω) must be balanced. According to this prior art design, transformer modules B21 of a processing circuit B2 of the network connector B are adapted for impedance matching, however, these transformer modules B21 cannot keep the impedance of the motherboard A in fully balance with the impedance of the network cable B1, causing network signal transmission instability, interference or signal interruption. The transformer modules B21 of the network connector B are made by manually winding coils round respective magnetic cores, where the number of turns in the coils determines the application function of the transformer modules B21. However, manually winging the coils round the respective magnetic cores tend to cause overlapped or staggered coils. Further, it is difficult to accurately control the number of turns in the coils of the transformer modules and their dimensions. In actual application, the functioning of the transformer modules can be unstable.

Therefore, it is desirable to provide a network processing circuit that eliminates the aforesaid problems and that effectively achieves impedance matching to keep the impedance of the network cable in balance with the impedance of the motherboard of the computer, so as to avoid network signal transmission interference and to assure network signal transmission stability.

SUMMARY OF THE INVENTION

The present invention has been accomplished under the circumstances in view. It is therefore the main object of the present invention to provide an impedance matching device-integrated processing circuit, which uses microstrip coils of impedance matching devices to increase the impedance of the processing circuit, keeping the impedance at the motherboard of the computer in balance with the impedance at the network cable to further enhance signal transmission stability.

To achieve this and other objects of the present invention, an impedance matching device-integrated network signal processing circuit is installed in a network connector and electrically connected between a motherboard of a computer and a network cable. The impedance matching device-integrated network signal processing circuit comprises a first connection terminal electrically connected to a network chip, a second connection terminal electrically connected to the network connector, a plurality of circuit paths electrically connected between the first connection terminal and the second connection terminal, a coupling circuit that comprises a plurality of capacitors respectively connected in series to the circuit paths and a plurality of inductors respectively connected in parallel between each two adjacent circuit paths, and a plurality of impedance matching devices respectively electrically connected in series to each two adjacent circuit paths. Each impedance matching device comprises two microstrip coils respectively electrically connected in series to each two adjacent circuit paths between the first connection terminal and respective inductors.

By means of the functioning of the microstrip coils of the impedance matching devices to increase the inductive impedance effect of the processing circuit, an impedance matching is achieved to keep the impedance at the network cable in balance with the impedance at the motherboard of the computer, avoiding network signal transmission interference, assuring a high level of network signal transmission stability and enhancing network signal transmission speed.

Preferably, the microstrip coils of the impedance matching devices are respectively formed by continuously and closely curving one single coil wire back and forth into a planar grid-like arrangement, each having one end thereof electrically connected to the first connection terminal and an opposite end thereof electrically connected to one respective inductor of the coupling circuit. Further, through a circuit layout design, the circuit paths of the processing circuit and the inductors and capacitors of the coupling circuit and the impedance matching devices are packaged in the multilayer circuit board of the network connector. Further, the planar grid-like arrangement of the microstrip coils of the impedance matching devices enables the multilayer circuit board of the network connector to be shaped like a thin strip, so that the height of the processing circuit of the impedance matching device-integrated network signal processing circuit can be greatly reduced without occupying much installation space. This low profile characteristic makes the impedance matching device-integrated network signal processing circuit practical for use in any of a variety of electronic products that have light, thin, short and small characteristics.

DETAILED DESCRIPTION OF THE PREFERRED EMBODIMENT

Figure 1:
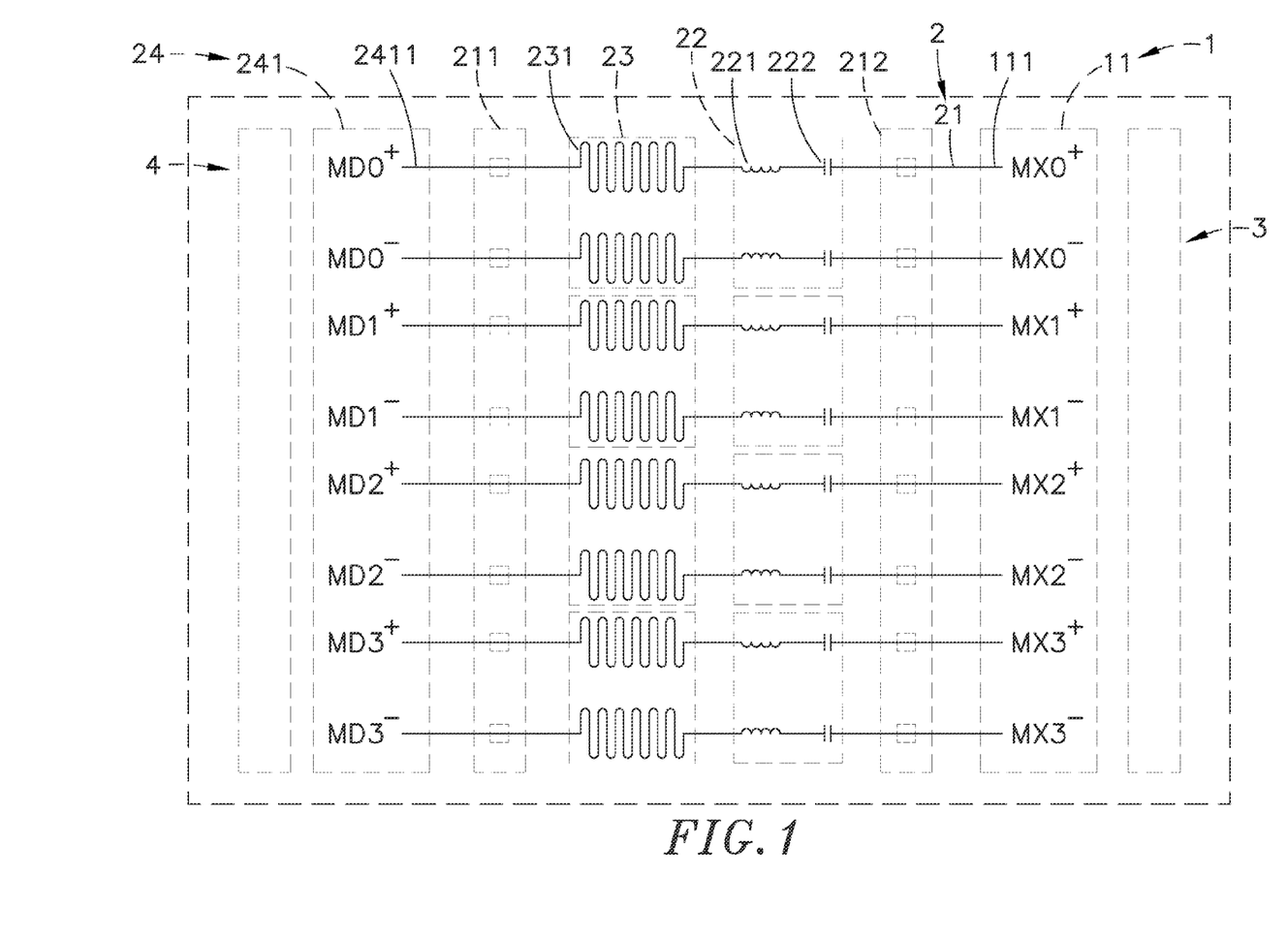
FIG. 1 is a simple circuit diagram of an impedance matching device-integrated network signal processing circuit in accordance with the present invention.
Figure 2:
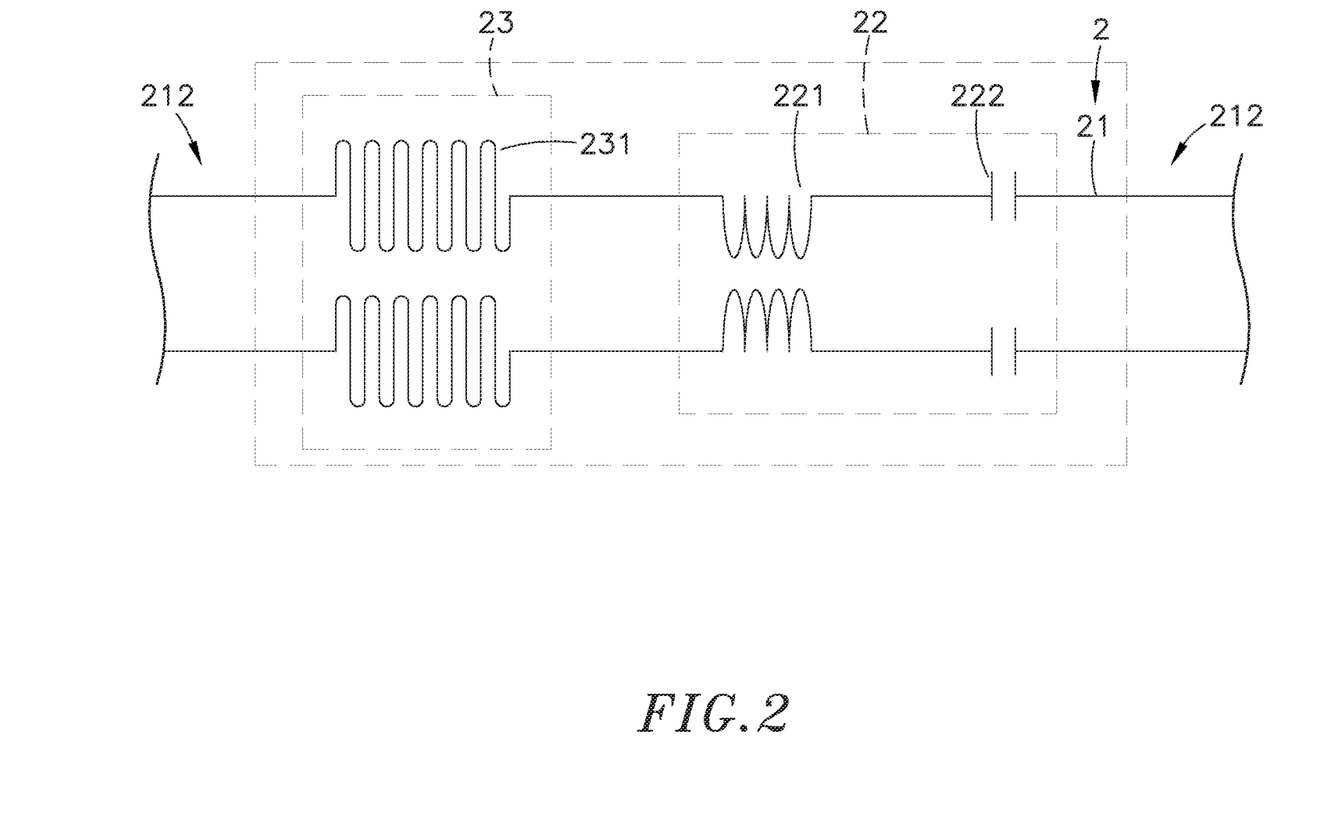
FIG. 2 is an enlarged view of a part of the processing circuit of the impedance matching device-integrated network signal processing circuit in accordance with the present invention.
Figure 3:
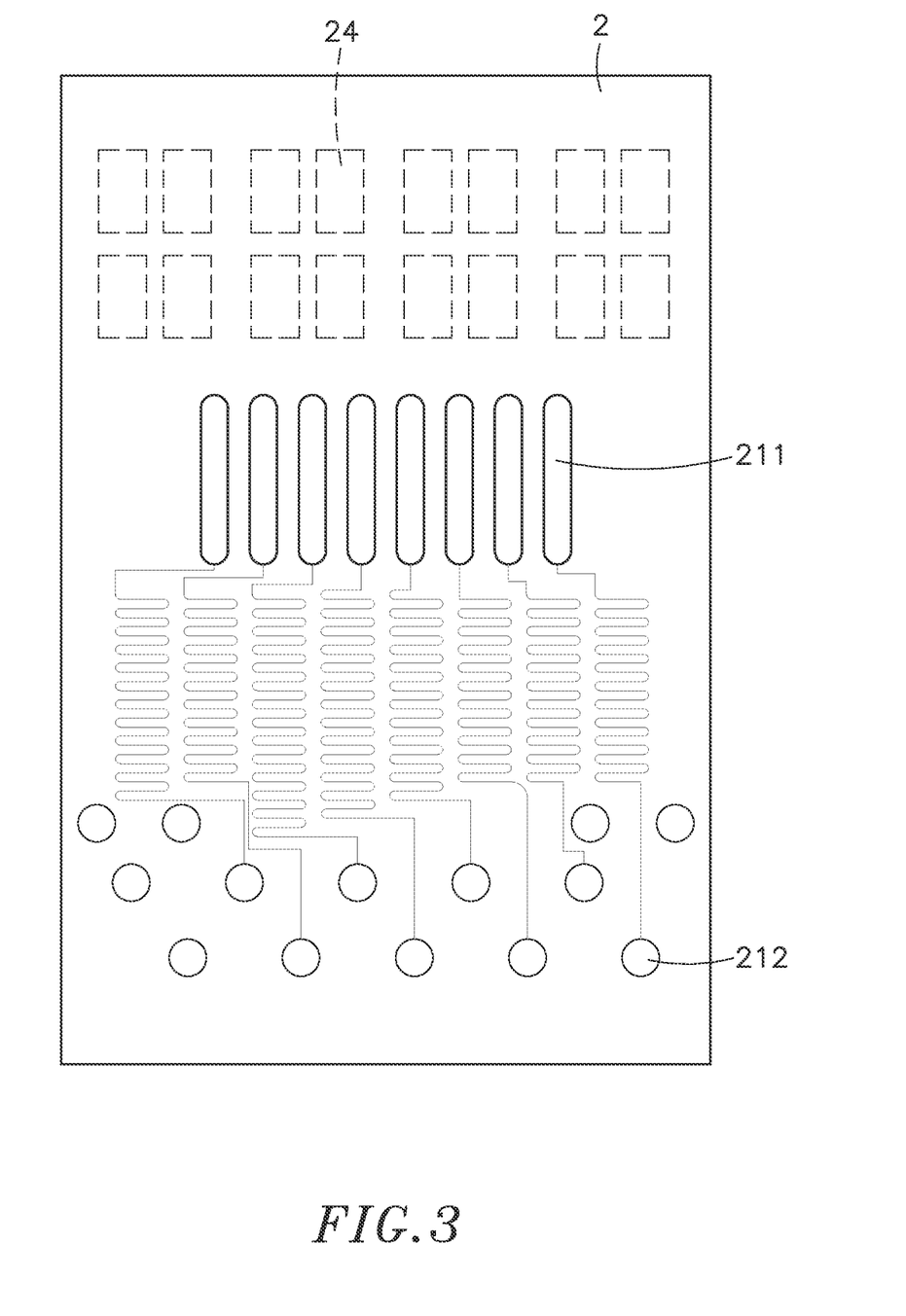
FIG. 3 is a plain view of the processing circuit of the impedance matching device-integrated network signal processing circuit in accordance with the present invention.
Figure 4:
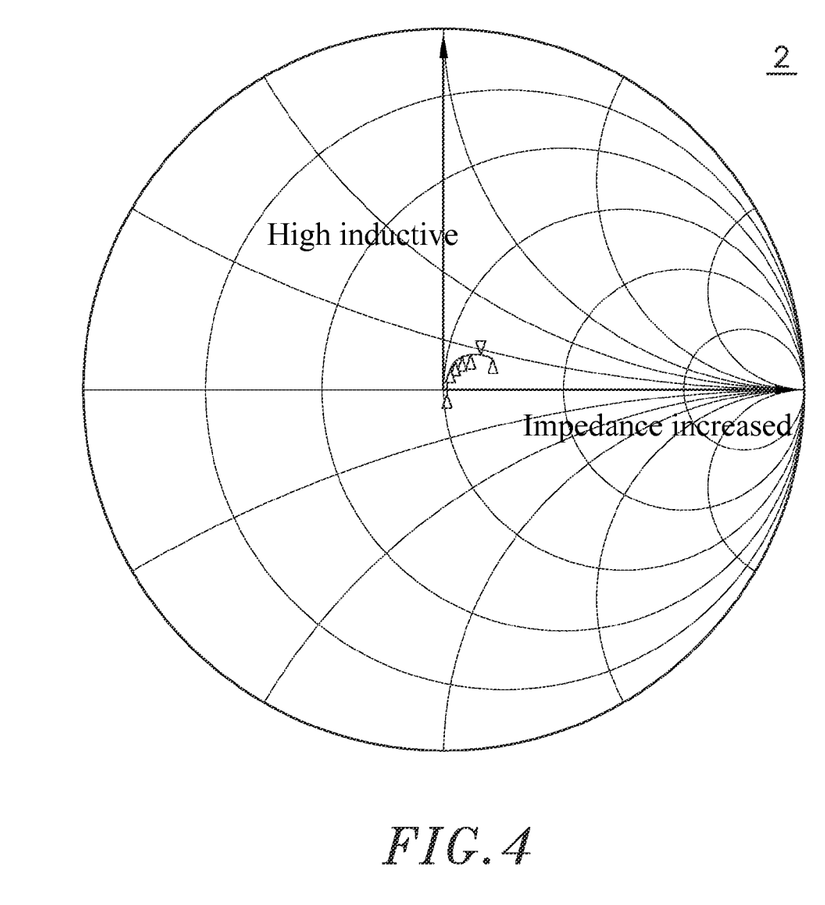
FIG. 4 is a Smith chart of the network signal processing circuit of the present invention (I).
Figure 5:
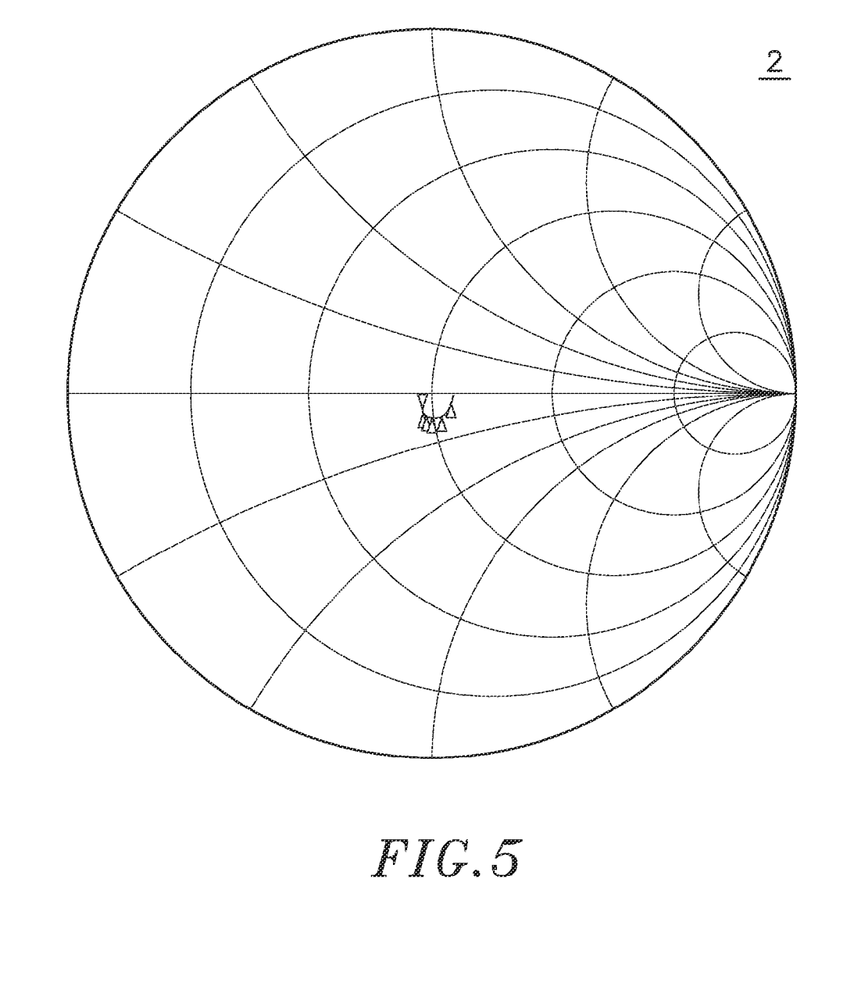
FIG. 5 is a Smith chart of the network signal processing circuit of the present invention (II).
Figure 6:
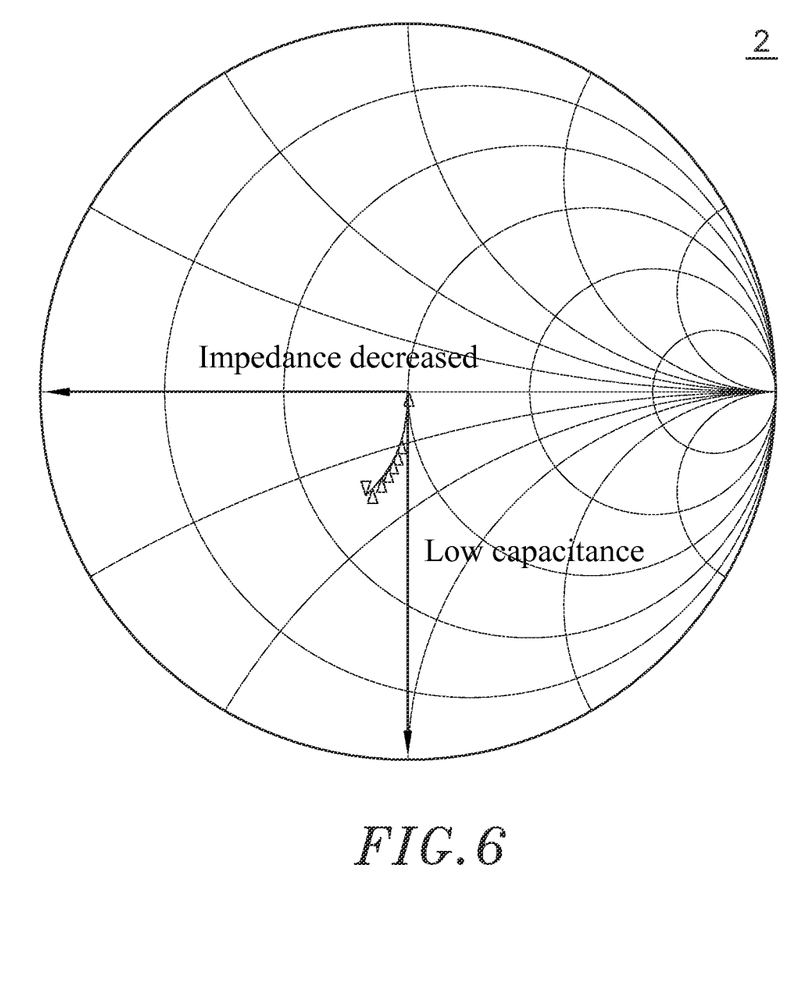
FIG. 6 is a Smith chart of a network signal processing circuit according to the prior art.

Referring to FIGS. 1-3, a simple circuit diagram of an impedance matching device-integrated network signal processing circuit in accordance with the present invention, an enlarged view of a part of the processing circuit of the impedance matching device-integrated network signal processing circuit and a plain view of the processing circuit of the impedance matching device-integrated network signal processing circuit are shown. As illustrated, the impedance matching device-integrated network signal processing circuit comprises a network connector 1, a processing circuit 2, a motherboard 3, and a network cable 4.

The network connector 1 comprises a multilayer circuit board having packaged therein, by means of a circuit layout design, the multiple circuit paths 21, inductors 221 and capacitors 222 of a coupling circuit 22 and impedance matching devices 23 of the processing circuit 2. The capacitors 222 of coupling circuit 22 are respectively connected in series to the circuit paths 21. The inductors 221 of coupling circuit 22 are respectively connected in parallel between each two adjacent circuit paths 21. Further, the processing circuit 2 has a first connection terminal 211 located at one side thereof and electrically connected to a network chip 24, and a second connection terminal 212 located at an opposite side thereof and electrically connected to the network connector 1. The multiple circuit paths 21 are electrically connected between the first connection terminal 211 and the second connection terminal 212. Each impedance matching device 23 comprises two microstrip coils 231 electrically connected in series to respective two adjacent circuit paths 21 of the processing circuit 2 and electrically connected in series between the first connection terminal 211 and respective inductors 221 of the coupling circuit 22. The microstrip coils 231 are respectively formed by continuously and closely curving one single coil wire back and forth into a planar grid-like arrangement, wherein each microstrip coil 231 has its one end electrically connected to the first connection terminal 211, and its other end electrically connected to one respective inductor 221 of the coupling circuit 22. Thus, the network connector 1, the processing circuit 2 and the impedance matching device 23 constitute a network signal processing circuit for the impedance matching device-integrated network signal processing circuit.

In application, the network connector 1 is electrically connected to a motherboard 3 of a computer (not shown) and a network cable 4 so that a network signal can be transmitted through the network cable 4 to the processing circuit 2 in the network connector 1 and then transmitted by the network connector 1 to motherboard 3. During the transmission of the network signal, an impedance mismatch occurs between the motherboard 3 (about 85Ω) and the network cable 4 (about 100Ω). At this time, the microstrip coils 231 of the impedance matching devices 23 of the processing circuit 2 in the network connector 1 increase the impedance of the processing circuit 2 (by about 15Ω) so as to match the impedance of the network cable 4 to the impedance of the motherboard 3, keeping the impedance in balance between the motherboard 3 of the computer and the network cable 4 (about 100Ω:100Ω), and thus, the network signal transmission becomes more stable, smooth and fast, avoiding interruption and noise interference.

Through a circuit layout design, the circuit paths 21 of the processing circuit 2 and the inductors 221 and capacitors 222 of the coupling circuit 22 and the impedance matching devices 23 are packaged in the multilayer circuit board of the network connector 1. Further, the planar grid-like arrangement of the microstrip coils 231 of the impedance matching devices 23 enables the multilayer circuit board of the network connector 1 to be shaped like a thin strip, so that the height of the processing circuit of the impedance matching device-integrated network signal processing circuit can be greatly reduced without occupying much installation space. This low profile characteristic makes the impedance matching device-integrated network signal processing circuit practical for use in any of a variety of electronic products that have light, thin, short and small characteristics, and thus, the invention is practical for a wide range of applications and can be used in different motherboards from different manufacturers to enhance network signal transmission stability without interference.

Referring to FIGS. 1, 4, 5, 6 and 7, a simple circuit diagram of an impedance matching device-integrated network signal processing circuit in accordance with the present invention, a Smith chart of the network signal processing circuit of the present invention (I), a Smith chart of the network signal processing circuit of the present invention (II), a Smith chart of a network signal processing circuit according to the prior art, and a simple circuit diagram of a network signal processing circuit according to the prior art are shown. As illustrated, during the transmission of a network signal through a network signal processing circuit between a motherboard A and a network cable B1 according to the prior art, a condition of network signal impedance imbalance occurs, forming a low impedance that exhibits capacitive (see FIG. 6). Excessive low impedance in the processing circuit B2 can lead to network signal transmission instability. In the impedance matching device-integrated network signal processing circuit in accordance with the present invention, the processing circuit 2 has the microstrip coil 231 of one respective impedance matching device 23 connected in series to each circuit path 21 thereof to increase the impedance (see FIG. 1 and FIG. 4) for matching with the input impedance, keeping the impedance at the network cable 4 in balance with the impedance at the motherboard 3 of the computer (see FIG. 5).

As disclosed in the contents of the above-mentioned Smith charts (see FIG. 4 and FIG. 5), during transmission of a network signal through the processing circuit 2, any impedance difference between the motherboard 3 and the network cable 4 can cause signal transmission instability. By means of the functioning of the microstrip coils 231 of the impedance matching devices 23 of the processing circuit 2 to increase the inductive impedance effect of the processing circuit 2, an impedance matching is achieved to keep the impedance at the network cable 4 in balance with the impedance at the motherboard 3 of the computer (see FIG. 5), assuring a high level of network signal transmission stability and enhancing network signal transmission speed.

Further, the first connection terminal 211 of the processing circuit 2 comprises a pin set 241 consisting of pins 2411 that are respectively electrically connected to respective contacts of the network chip 24 and identified as MD0+, MD0−, MD1+, MD1−, MD2+, MD2−, MD3+ and MD3−. Further, the second connection terminal 212 of the processing circuit 2 comprises a pin set 11 consisting of pins 111 that are respectively electrically connected to respective contacts of the network connector 1 that are electrically connected to respective contacts of are identified as MX0+, MX0−, MX1+, MX1−, MX2+, MX2−, MX3+ and MX3−. However, this configuration layout is changeable to fit different design requirements.

As described above, the impedance matching device-integrated network signal processing circuit has the multiple circuit paths 21, inductors 221 and capacitors 222 of the coupling circuit 22 and the impedance matching devices 23 of the processing circuit 2 be packaged in the multilayer circuit board of the network connector 1 by means of a circuit layout design. The capacitors 222 of coupling circuit 22 are respectively connected in series to the circuit paths 21. The inductors 221 of coupling circuit 22 are respectively connected in parallel between each two adjacent circuit paths 21. Further, the processing circuit 2 has a first connection terminal 211 located at one side thereof and electrically connected to a network chip 24, and a second connection terminal 212 located at an opposite side thereof and electrically connected to the network connector 1, wherein the first connection terminal 211 is electrically connected to the network chip 24; the second connection terminal 212 is electrically connected to the pins 111 of the pin set 11; the microstrip coil 231 of the impedance matching devices 23 are respectively connected in series to the circuit paths 21 between the first connection terminal 211 and the inductors 221 so that the microstrip coils 231 of the impedance matching devices 23 of the processing circuit 2 in the network connector 1 can increase the impedance of the processing circuit so as to match the impedance of the network cable 4 to the impedance of the motherboard 3, keeping the impedance in balance between the motherboard 3 of the computer and the network cable 4, and thus, the network signal transmission becomes more stable, smooth and fast, avoiding interruption and noise interference.

In conclusion, the invention provides an impedance matching device-integrated processing circuit installed in a network connector and electrically connected between a motherboard of a computer and a network cable. The impedance matching device-integrated processing circuit comprises a first connection terminal electrically connected to a network chip, a second connection terminal electrically connected to the network connector, a plurality of circuit paths electrically connected between the first connection terminal and the second connection terminal, a coupling circuit comprising a plurality of capacitors respectively connected in series to the circuit paths and a plurality of inductors respectively connected in parallel between each two adjacent circuit paths, and a plurality of microstrip coils of impedance matching devices respectively electrically connected in series to each two adjacent circuit paths for increasing the impedance of the processing circuit to achieve impedance matching between the network cable and the impedance of the motherboard, and thus, the network signal transmission stability is enhanced.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An impedance matching device-integrated processing circuit installed in a network connector and electrically connected between a motherboard of a computer and a network cable, comprising a first connection terminal electrically connected to a network chip, a second connection terminal electrically connected to said network connector, a plurality of circuit paths electrically connected between said first connection terminal and said second connection terminal, a coupling circuit comprising a plurality of capacitors respectively connected in series to said circuit paths and a plurality of inductors respectively connected in parallel between each two adjacent said circuit paths, and a plurality of impedance matching devices respectively electrically connected in series to each two adjacent said circuit paths, each said impedance matching device comprising two microstrip coils respectively electrically connected in series to each two adjacent said circuit paths between said first connection terminal and respective said inductors, wherein said impedance matching devices are formed in a multilayer circuit board of said network connector by means of a circuit layout design, and electrically connected in series to said circuit paths between said first connection terminal and said second connection terminal.

2. The impedance matching device-integrated processing circuit as claimed in claim 1, wherein said first connection terminal of said processing circuit comprises a pin set consisting of pins that are respectively electrically connected to respective contacts of said network chip; said second connection terminal of said processing circuit comprises a pin set consisting of pins that are respectively electrically connected to respective contacts of said network connector.

3. The impedance matching device-integrated processing circuit as claimed in claim 1, wherein said microstrip coils of said impedance matching devices are respectively formed by continuously and closely curving one single coil wire back and forth into a planar grid-like arrangement, each said microstrip coil having one end thereof electrically connected to said first connection terminal and an opposite end thereof electrically connected to one respective said inductor of said coupling circuit.

* * * * *